United States Patent
Han et al.

(10) Patent No.: US 11,530,955 B2
(45) Date of Patent: Dec. 20, 2022

(54) METHOD FOR MEASURING GAS TEMPERATURE IN PLASMA

(71) Applicant: Dalian University of Technology, Dalian (CN)

(72) Inventors: Daoman Han, Dalian (CN); Yongxin Liu, Dalian (CN); Fei Gao, Dalian (CN); Zigeng Liu, Dalian (CN); Zhenguo Jing, Dalian (CN); Younian Wang, Dalian (CN)

(73) Assignee: Dalian University of Technology, Dalian (CN)

( * ) Notice: Subject to any disclaimer, the term of this patent is extended or adjusted under 35 U.S.C. 154(b) by 284 days.

(21) Appl. No.: 17/001,132

(22) Filed: Aug. 24, 2020

(65) Prior Publication Data

US 2021/0072096 A1    Mar. 11, 2021

(30) Foreign Application Priority Data

Sep. 5, 2019 (CN) .......................... 201910838772.5

(51) Int. Cl.
  *G01K 11/32* (2021.01)
  *G01J 3/28* (2006.01)
  *G01K 1/14* (2021.01)

(52) U.S. Cl.
  CPC .............. *G01K 11/32* (2013.01); *G01J 3/28* (2013.01); *G01K 1/14* (2013.01)

(58) Field of Classification Search
  CPC ...... G01K 11/32; G01K 1/14; G01K 11/3206; G01J 3/28; G02B 6/02057; G02B 6/2746;
  (Continued)

(56) References Cited

U.S. PATENT DOCUMENTS 5,673,750 A    10/1997   Tsubone
2017/0205256 A1*  7/2017  Kim .................... G01J 9/00

FOREIGN PATENT DOCUMENTS

CN    101387559        3/2009
CN    101387559 A  *   3/2009
(Continued)

OTHER PUBLICATIONS

Search Report in Chinese Application No. 201910838772.5, dated Feb. 21, 2020, 1 page.
(Continued)

*Primary Examiner* — Brandi N Hopkins
*Assistant Examiner* — Janice M Soto
(74) *Attorney, Agent, or Firm* — Fish & Richardson P.C.

(57) ABSTRACT

The present invention discloses a device for measuring gas temperature in plasma, including: a vacuum chamber, a fiber optic temperature sensor, a quartz tube, a circulator, a spectrometer, a broadband light source and a computer. One end of the quartz tube is inserted into the vacuum chamber. The fiber optic temperature sensor is located in the plasma in the vacuum chamber and fixed to the quartz tube. The fiber optic temperature sensor is connected to the circulator by means of an optical fiber passing through the quartz tube. The circulator is connected to the broadband light source and the spectrometer through optical fibers, respectively. The spectrometer is electrically connected to the computer which is configured to read and record spectra collected by the spectrometer.

5 Claims, 3 Drawing Sheets

(58) Field of Classification Search
CPC ........... H01J 37/32917; H01J 37/32935; H01J 37/32972
See application file for complete search history.

(56) References Cited

FOREIGN PATENT DOCUMENTS

| CN | 107465589 | | | 2/2018 | |
|---|---|---|---|---|---|
| CN | 109580546 | | | 4/2019 | |
| CN | 109580546 | A | * | 4/2019 | ......... G01D 5/35312 |

OTHER PUBLICATIONS

Han et al., "Determination of neutral temperature using fiber Bragg grating sensor in capacitively coupled argon plasmas", J. Appl. Phys. 119, 113302 (2016).

Liu et al., "Fiber Bragg grating-based temperature sensor for neutral gas in capacitively coupled plasmas" Proc. of SPIE vol. 10025, 1002502, (2016).

Han et al., "Observation of the standing wave effect in large-area, very-high-frequency capacitively coupled plasmas by using a fiber Bragg grating sensor", Journal of Applied Physics 123, 223304 (2018).

Office Action issued in CN201910838772.5, dated Mar. 2, 2020 and its machine translation.

* cited by examiner

METHOD FOR MEASURING GAS TEMPERATURE IN PLASMA

TECHNICAL FIELD

The present invention relates to the technical field of plasma gas detection, and in particular to a device for measuring gas temperature in plasmas.

BACKGROUND

Low-pressure radio-frequency (RF) capacitively-coupled plasma (CCP) sources have been widely used in the fields of material processing, such as dielectric etching and thin film deposition due to their advantages of simple structure, and good uniformity. A plasma is mainly composed of neutral gas molecules (atoms), electrons, ions, and active reactive species. The neutral gas molecules (atoms) account for more than 99%, and the gas temperature is critical for various parameters of the plasma, which in turn greatly affects the material processing. For example, the temperature distribution of the neutral gas will significantly affect the plasma density distribution and the flow distribution in the plasma, which in turn affects the uniformity of material processing. The temperature of the neutral gas will also affect the energy distribution function of the electrons, which in turn will affect the efficiency of material processing. Therefore, the gas temperature of the low-pressure RF-CCP is of important scientific interest and of great significance in industrial application.

However, due to the complex electromagnetic environment of the low-pressure RF plasma, there are few methods for the determination of gas temperature in plasmas. For example, a thermocouple sensor is widely used for gas temperature measurement. However, this method is susceptible to various electromagnetic fields, and the thermocouple itself will also interfere with the plasma; therefore, this method is not suitable to measure the temperature of the neutral gas in the low-pressure RF plasma.

At present, traditional neutral gas temperature measurement methods are mainly based on spectroscopic diagnostics, such as optical emission spectroscopy, absorption spectroscopy, laser-induced fluorescence. Such diagnostic methods are often based on some assumptions, for example, that the rotational temperature and the translational temperature of a gas are equal. Under atmospheric pressure, this assumption is true, so the measurement results are relatively accurate. However, under low pressure conditions (less than 100 Pa), the temperature value measured by spectroscopic diagnostics is very different from the real temperature of the neutral gas, and no satisfactory measurement result can be obtained. In addition, traditional spectroscopy diagnostic methods have some limitations, such as long response time, expensive equipment, complicated calculation process, poor spatial resolution. Therefore, the temperature measurement of the neutral gas in a low-pressure RF-CCP has always been a problem.

SUMMARY

In view of this, an objective of the present invention is to provide a device for measuring gas temperature in plasmas. One scientific application example is that the gas temperature measurement is capable of characterizing the electromagnetic effect in the very high frequency (VHF) large-area CCP by using the measured temperature of the neutral gas with fast response and accurate detection.

To achieve the above objective, the present invention provides the following solutions:

A device for measuring gas temperature in plasmas includes a vacuum chamber, a fiber optic temperature sensor, a quartz tube, a circulator, a spectrometer, a broadband light source and a computer, where one end of the quartz tube is inserted into the vacuum chamber;

the fiber optic temperature sensor is located in the plasma of the vacuum chamber and fixed to the quartz tube;

the fiber optic temperature sensor is connected to the circulator by means of an optical fiber passing through the quartz tube;

the circulator is connected to the broadband light source and the spectrometer through optical fibers, respectively; and the spectrometer is electrically connected to the computer which is configured to read and record spectra collected by the spectrometer;

Optionally, the device further includes a two-dimensional driving system, where the two-dimensional driving system is configured to move the quartz tube horizontally and vertically; and one end of the quartz tube is inserted into the vacuum chamber through the two-dimensional driving system.

Optionally, an inner diameter of the quartz tube gradually decreases from the end inserted into the vacuum chamber to the other end.

Optionally, the inner diameter of the quartz tube gradually decreases from 0.1 cm to 0.02 cm.

Optionally, an end of the quartz tube that has the smallest inner diameter is sealed with the vacuum cement.

Optionally, the device further includes a packaging system which retains the quartz tube in the two-dimensional driving system.

Optionally, the vacuum sealing system includes a first rubber sealing ring, a first flange joint, a second rubber sealing ring, a second flange joint and a baffle, where the first rubber sealing ring sleeves the first flange joint;

the first flange joint and the second rubber sealing ring successively sleeve the quartz tube in a direction from the end, having the largest inner diameter, of the quartz tube to the end, having the smallest inner diameter, of the quartz tube;

the second flange joint and the first flange joint are symmetrically disposed about the central position of the second rubber sealing ring, and the two ends of the second rubber sealing ring are clamped in the first flange joint and the second flange joint, respectively;

the baffle sleeves the second flange joint; a screw hole is formed in the baffle; and the first flange joint is connected to a flange port in the two-dimensional driving system, and the baffle is fixed to the two-dimensional driving system by means of a screw.

Optionally, each of the optical fibers used has an outer diameter of 0.0125 cm.

According to the specific examples provided by the present invention, the present invention discloses the following technical effects: in the device for measuring gas temperature in a plasma provided by the present invention, the broadband light source emits a beam of broadband light to the head of the fiber optic temperature sensor via the circulator and the optical fiber. A beam of reflected light then returns along the original path due to the periodic structure of the fiber optic temperature sensor, and its spectral line is split by the spectrometer, and read and recorded by the computer. When the temperature of the neutral gas in a plasma in the vacuum chamber rises or falls, the central wavelength value of the reflected light will rapidly increase or decrease instantly. Then, the change in the temperature of the neutral gas in a plasma can be obtained according to the change of the measured central wavelength value of the reflected light. In addition, an optical signal, rather than an electrical signal, is used as a carrier for the fiber optic temperature sensor in the device, which avoids the interference of the electromagnetic fields of the plasma and allows to improve the detection accuracy.

BRIEF DESCRIPTION OF DRAWINGS

To describe the technical solutions in the examples of the present invention or in the prior art more clearly, the following part briefly introduces the accompanying drawings required for describing the examples. Apparently, the accompanying drawings in the following description show merely some examples of the present invention, and a person of ordinary skill in the art may still derive other drawings from these accompanying drawings without creative efforts.

Figure 1:
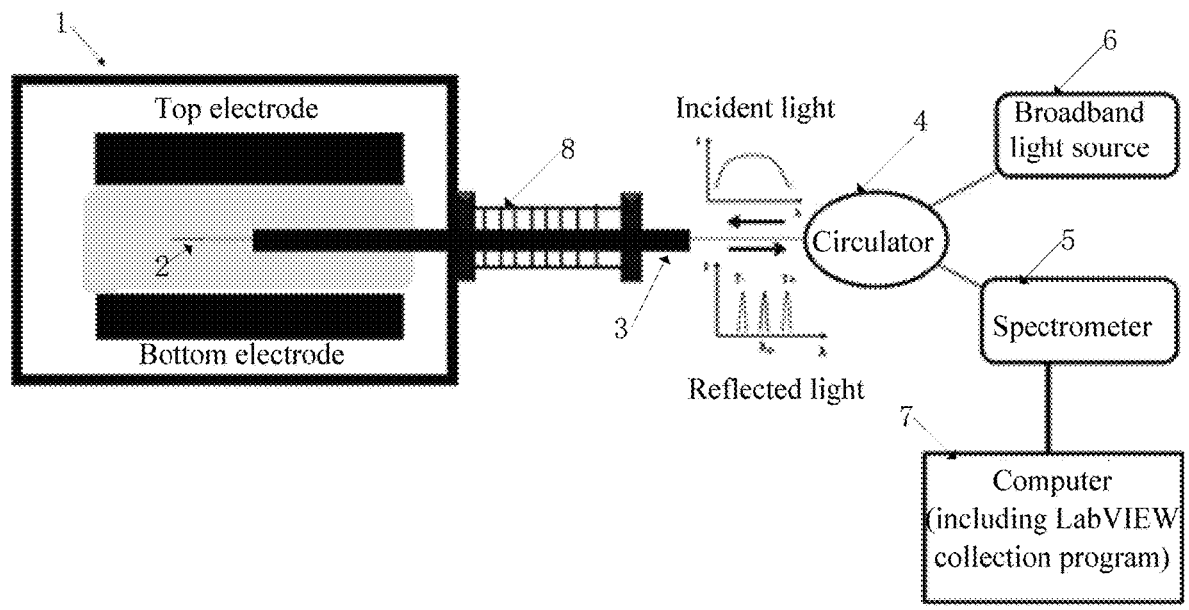
FIG. 1 is a schematic structural diagram of a device for measuring gas temperature in a plasma according to an example of the present invention.
Figure 2:
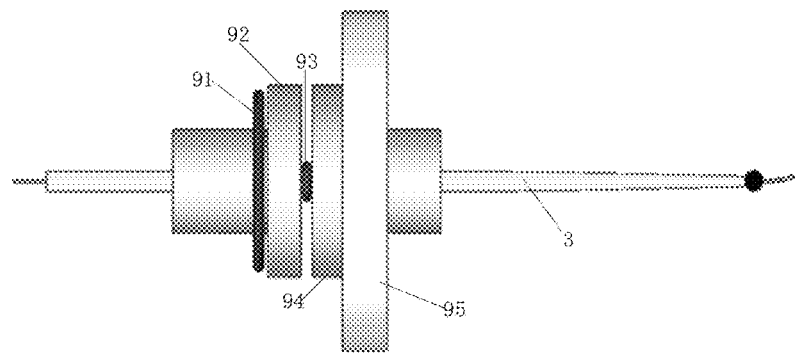
FIG. 2 is a schematic structural diagram of a sealing system according to an example of the present invention.

What reference numerals represent is explained as follows: 1—vacuum chamber, 2—fiber optic temperature sensor, 3—quartz tube, 4—circulator, 5—spectrometer, 6—broadband light source, 7—computer, 8—two-dimensional driving system, 9—sealing system, 81—bellows, 82—vertical translation shaft, 83—horizontal translation shaft, 91—first rubber sealing ring, 92—first flange joint, 93—second rubber sealing ring, 94—second flange joint, and 95—baffle.

DETAILED DESCRIPTION

The following clearly and completely describes the technical solutions in the examples of the present invention with reference to accompanying drawings in the examples of the present invention. Apparently, the described examples are merely a part rather than all of the examples of the present invention. All other examples obtained by a person with ordinary skills in the art based on the examples of the present invention without creative efforts shall fall within the protection scope of the present invention.

An objective of the present invention is to provide a device for measuring gas temperature in a plasma. One scientific application example is that the gas temperature measurement is capable of characterizing the electromagnetic effect in VHF large-area CCP by using the measured temperature of the neutral gas with fast response and accurate detection.

In order to make the above objectives, features, and advantages of the present invention more understandable, the present invention will be described in further detail below with reference to the accompanying drawings and detailed examples.

FIG. 1 is a schematic structural diagram of a device for measuring gas temperature in a plasma according to an example of the present invention. As shown in FIG. 1, a device for measuring gas temperature in a plasma includes a vacuum chamber 1, a fiber optic temperature sensor 2, a quartz tube 3, a circulator 4, a spectrometer 5, a broadband light source 6 and a computer 7.

One end of the quartz tube 3 is inserted into the vacuum chamber 1.

The fiber optic temperature sensor 2 is located in the plasma gas in the vacuum chamber 1 and fixed to the quartz tube 3.

The fiber optic temperature sensor 2 is connected to the circulator 4 by means of an optical fiber passing through the quartz tube 3.

The circulator 4 is connected to the broadband light source 6 and the spectrometer 5 through optical fibers, respectively.

The spectrometer 5 is electrically connected to the computer 7 which is configured to read and record spectra collected by the spectrometer.

Figure 3:
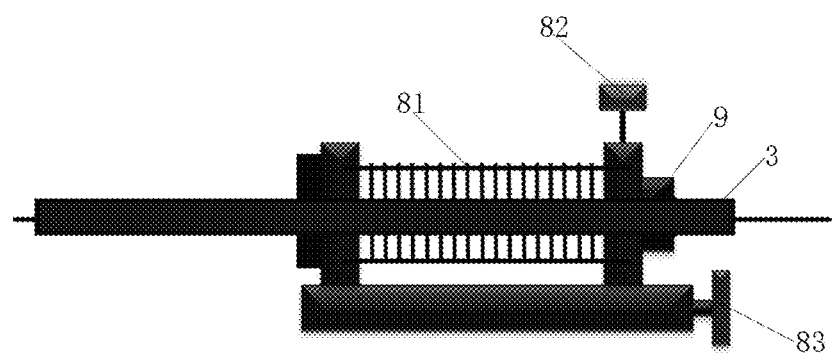
FIG. 3 is a schematic structural diagram of a two-dimensional driving system according to an example of the present invention.

The device provided by the present invention may further include a two-dimensional driving system 8. As shown in FIG. 3, the two-dimensional driving system 8 is a two-dimensional driving device existing in the prior art, which is mainly composed of a bellows, a horizontal moving shaft, a vertical moving shaft, and the like, and which mainly functions to move the quartz tube 3 horizontally and vertically. Moreover, since Bragg fiber grating sensor 2 is fixed to the quartz tube 3, the quartz tube 3 is fixed to the two-dimensional driving system 8. Whether the quartz tube 3 is moved vertically or horizontally, only the measurement position of the fiber optic temperature sensor 2 is changed with no any other influence.

One end of the quartz tube 3 is inserted into the vacuum chamber 1 through the two-dimensional driving system 8.

An inner diameter of the quartz tube 3 gradually decreases from the end inserted into the vacuum chamber 1 to the other end. Besides, the inner diameter of the quartz tube 3 gradually decreases from 0.1 cm to 0.02 cm.

In order to further increase the airtightness of the entire device, the end of the quartz tube 3 that has the smallest inner diameter is sealed with a vacuum cement.

The device provided by the present invention may further include a sealing system 9 which retains the quartz tube 3 in the two-dimensional driving system 8.

The sealing system 9 includes a first rubber sealing ring 91, a first flange joint 92, a second rubber sealing ring 93, a second flange joint 94 and a baffle 95.

The first rubber sealing ring 91 sleeves the first flange joint 92.

The first flange joint 92 and the second rubber sealing ring 93 successively sleeve the quartz tube 3 in a direction from the end, having the largest inner diameter, of the quartz tube 3 to the end, having the smallest inner diameter, of the quartz tube 3.

The second flange joint 94 and the first flange joint 92 are symmetrically disposed about the central position of the second rubber sealing ring 93, and the two ends of the second rubber sealing ring 93 are clamped in the first flange joint 92 and the second flange joint 94, respectively.

The baffle 95 sleeves the second flange joint 94. Moreover, a screw hole is formed in the baffle 95.

The first flange joint 92 is connected to a flange port in the two-dimensional driving system 8, and the baffle 95 is fixed to the two-dimensional driving system 8 by means of a screw.

The first flange joint 92 and the second flange joint 94 used in the sealing system 9 may be made of polytetrafluoroethylene.

Each of the optical fibers used in the device provided by the present invention has an outer diameter of 0.0125 cm. The fiber optic temperature sensor 2 can be a Bragg fiber grating sensor having a grating zone which is 1 cm long.

The above device provided by the present invention specifically operates by following the principle below:

The device is based on a reflective Bragg fiber grating sensor. Fiber Bragg Grating is one of the most common fiber gratings, which is formed by changing the refractive index of the fiber core zone to produce small periodic modulation. The basic expression of reflection of the Bragg grating is:

$$\lambda_B = 2n_{eff}\Lambda \tag{1}$$

where $n_{eff}$ represents the effective refractive index of the fiber core zone, and $\Lambda$ represents the period of the fiber core. Differentiating the equation (1) gives:

$$\Delta\lambda_B = 2n_{eff}\Delta\Lambda + 2\Lambda\Delta n_{eff} \tag{2}$$

where $\Delta\Lambda$ represents the influence of thermal expansion or axial strain caused by the temperature on the period of the fiber core, and $\Delta n_{eff}$ represents the influence of the thermo-optic effect caused by the temperature or the elastic-optic effect caused by the axial strain on the effective refractive index of the fiber core. Under vacuum (or low pressure) conditions, the grating fiber may not be affected by external forces. If the temperature changes, the thermo-optical and thermal expansion effects of the fiber material will cause the effective refractive index of the fiber core and the period of the grating to change, respectively, thus resulting in change of the reflected wavelength $\lambda_B$. After a series of mathematical derivations, the following equation can be given:

$$d\lambda_B = \alpha_T dT \tag{3}$$

Equation (3) shows the relationship between the change in wavelength of the fiber grating and the change in temperature, and $\alpha_T$ represents the sensitivity coefficient (constant) of the fiber grating temperature sensor. Therefore, the variation of temperature change can be obtained by monitoring the change in wavelength change. In experiment, the actual diagnostic process is as follows: the broadband light source 6 emits a beam of broadband light to the head of the Bragg fiber grating sensor 2 through the circulator 4 and the optical fiber. A beam of reflected light (narrowband light, having a center wavelength $\lambda_B$) then returns along the original path due to the periodic structure of the fiber optic temperature sensor, and its spectral line is split by the spectrometer 5, and read and recorded by the computer. When the temperature of the neutral gas of the plasma in the vacuum chamber 1 rises or falls, the value of $\lambda_B$ will increase or decrease correspondingly. Then, the change in the temperature of the neutral gas of the plasma can be obtained according to the change of the measured $\lambda_B$. If the fiber optic temperature sensor 2 is further calibrated with a standard heating furnace, a specific value of the temperature of the neutral gas can be obtained. In addition, the grating zone of the fiber grating sensor used is about 1 cm long, so that the entire device can have good spatial resolution in the detection process.

Figure 4A:
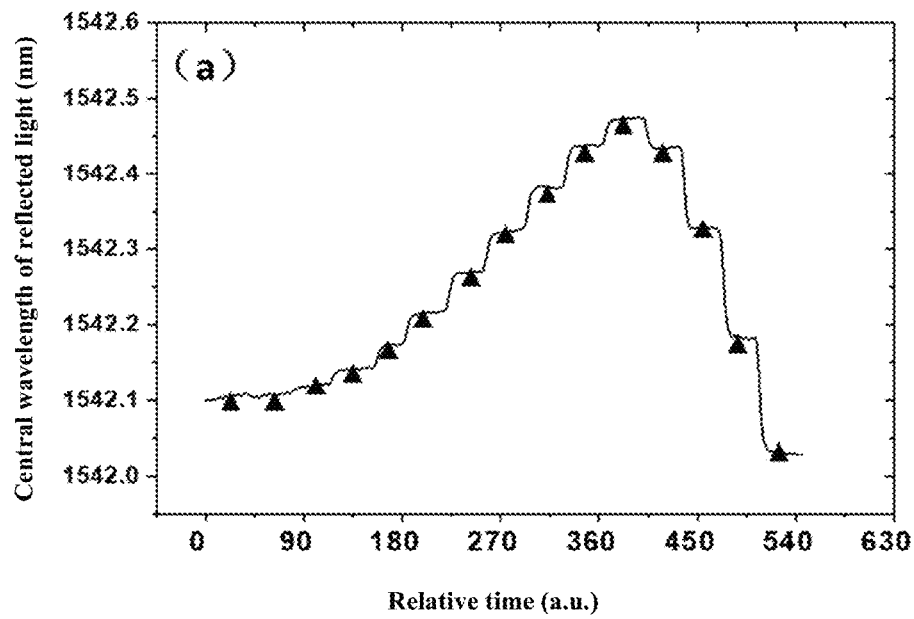
FIG. 4a is a schematic diagram of the center wavelength of reflected light changing with time according to an example of the present invention.
Figure 4B:
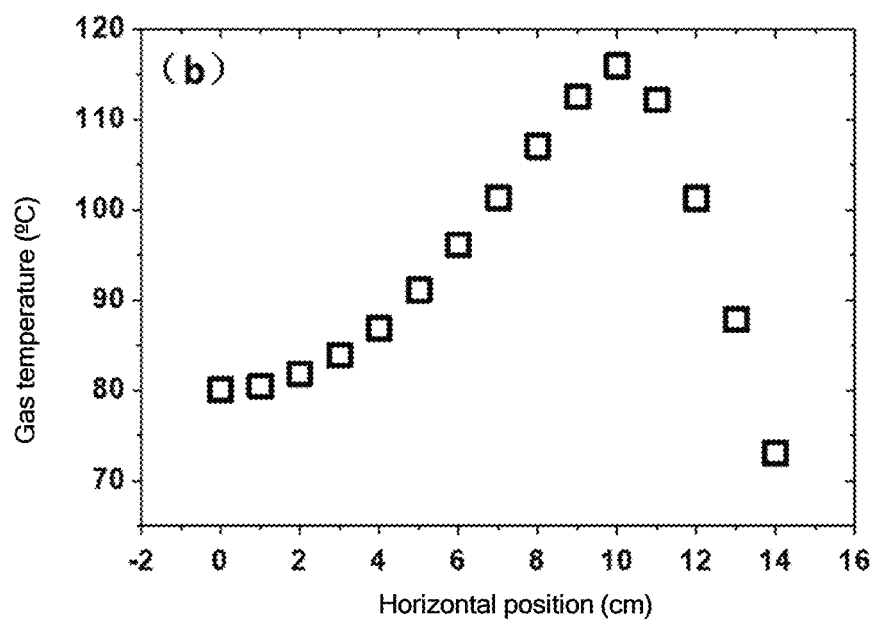
FIG. 4b is a schematic diagram of the distribution of the calculated gas temperature changing in the horizontal direction according to an example of the present invention.

FIG. 4a and FIG. 4b show the changes in the reflection wavelength of the Bragg fiber grating sensor that is moved horizontally by the two-dimensional driving system 8 during actual measurement under particular experimental conditions. FIG. 4a shows the original data collected by the computer, where each step represents the central wavelength value of the reflected light collected at a particular position in the horizontal direction. The sensor is allowed to stay at each position in the horizontal direction for sufficient time to achieve sufficient thermal balance between the grating zone of the fiber optic temperature sensor and the ambient neutral gas, and then moved to next position in the horizontal direction, with the black triangle in FIG. 4a representing that the wavelength at this moment is taken as the central wavelength of the reflected light at this position in the horizontal direction. FIG. 4b shows the neutral temperature distribution calculated using the relationship between the temperature and the center wavelength of the reflected light.

Figure 5:
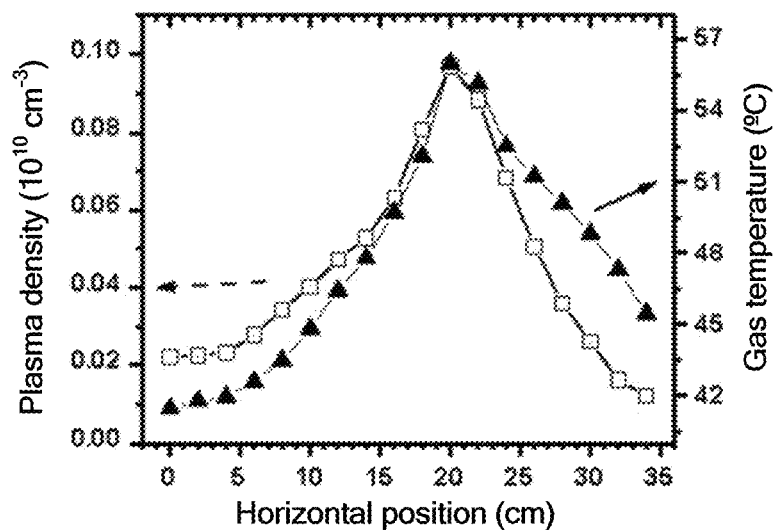
FIG. 5 is a schematic diagram of an edge effect under the condition of 27 MHz driving frequency according to an example of the present invention.
Figure 6:
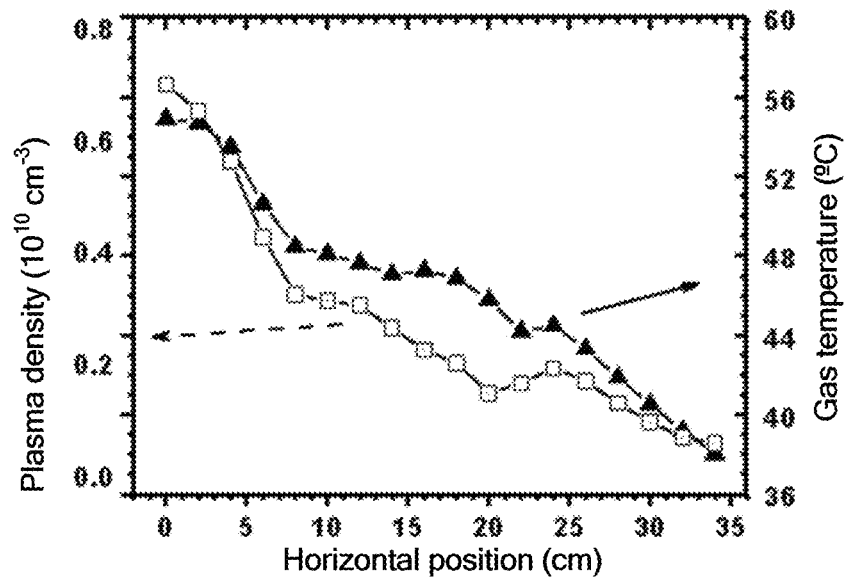
FIG. 6 is a schematic diagram of a standing wave effect under the condition of 100 MHz driving frequency according to an example of the present invention.

In recent years, in order to meet the needs of industry, the design of low-pressure RF-CCP sources tends to use larger-area plates and higher driving frequencies. Under particular conditions, so-called electromagnetic effects (standing wave effects, edge effects, etc.) will occur, and these effects will cause great non-uniformity of the plasma. For example, the standing wave effect (more significant under high-frequency excitation conditions) will cause the plasma density to show a center-high radial distribution, while the edge effect (more prominent under low-frequency excitation conditions) will cause the plasma density to show an edge-high radial distribution. Theoretically, in an electropositive plasma such as argon discharge, the horizontal distribution of the temperature of the neutral gas is consistent with that of the plasma density, so the distribution of the neutral gas temperature can be used to characterize the electromagnetic effect. In previous studies, due to the limitations of temperature measurement techniques, people usually can only use such parameters as plasma density to characterize electromagnetic effects. FIG. 5 and FIG. 6 show two application verification examples of the device provided by the present invention, where it was the first try to use the temperature distribution of the neutral gas to characterize the electromagnetic effect in the RF-CCP; and the plasma density distributions in the two figures were measured with a hairpin probe.

As shown in FIG. 5, it is a comparison of the horizontal distributions of the neutral gas temperature and the plasma density measured at a lower excitation frequency (27 MHz). It can be seen that the two parameters exhibit very similar radial distribution, showing a center-low and edge-high profile, indicating that the edge effect is very significant at this frequency. FIG. 6 shows a comparison of the radial distributions of the neutral gas temperature and the plasma density measured at a higher frequency (100 MHz). It can be seen that the distributions of the two parameters are very similar, both showing a center-high and edge-low profile, indicating that the standing wave effect is very significant under this condition. In general, the results shown in FIG. 5 and FIG. 6 indicate that the neutral gas temperatures in a plasma measured by the device provided by the present invention are correct and can be used to characterize the electromagnetic effects in the low-pressure RF-CCP, which also verify that this device has the advantage of resisting electromagnetic interference.

According to the specific examples provided by the present invention, the present invention discloses the following technical effects: in the device for measuring gas temperature in a plasma provided by the present invention, the broadband light source emits a beam of broadband light to the head of the fiber optic temperature sensor via the circulator and the optical fiber. A beam of reflected light then returns along the original path due to the periodic structure of the fiber optic temperature sensor, and its spectral line is split by the spectrometer, and read and recorded by the computer. When the temperature of the neutral gas in a plasma in the vacuum chamber rises or falls, the central wavelength value of the reflected light will rapidly increase or decrease accordingly. Then, the change in the temperature of the neutral gas in a plasma can be obtained according to the change of the measured central wavelength value of the reflected spectrum. In addition, an optical signal, rather than an electrical signal, is used as a carrier for the fiber optic temperature sensor in the device, which avoids the interference of the electromagnetic fields of a plasma and allows to improve its detection accuracy.

In addition, the device provided by the present invention also has the following advantages:

1. The principle of measurement is based on the special periodic structure of the fiber grating, which avoids the interference of the electromagnetic field in a plasma and can be used at 100 MHz or even higher frequencies.

2. The Bragg fiber grating sensor is small in size (approximately 0.0125 cm in diameter and approximately 1 cm in length of the grating zone), and thus is low in interference with a plasma and high in spatial resolution of measurement (having a radial resolution of up to 1 cm and an axial resolution of up to 0.1 cm).

3. The quartz tube has the variable diameter, the vacuum cement, the rubber sealing rings and the like, ensuring a good vacuum sealing effect required for the experiment, and they are easy to disassemble.

4. Compared with traditional spectroscopy diagnosis, the device is low in manufacturing cost and simple in operation and calculation process.

5. Based on the advantages of high spatial resolution and high precision of the device, the temperature distribution of the neutral gas is used for the first time to characterize the electromagnetic effect in the VHF large-area CCP. Each example of the present specification is described in a progressive manner, each example focuses on the difference from other examples, and the same and similar parts between the examples may refer to each other.

In this specification, several examples are used for illustration of the principles and implementations of the present invention. The description of the foregoing examples is used to help illustrate the method of the present invention and the core principles thereof. In addition, those of ordinary skill in the art can make various modifications in terms of specific implementations and scope of application in accordance with the teachings of the present invention. In conclusion, the content of the present specification shall not be construed as a limitation to the present invention.

What is claimed is:

1. A device for measuring gas temperature in plasma, the device comprising:
   a vacuum chamber,
   a fiber optic temperature sensor,
   a quartz tube,
   a circulator,
   a spectrometer,
   a broadband light source,
   a two-dimensional driving system,
   a sealing system which retains the quartz tube in the two-dimensional driving system, and
   a computer,
wherein
   one end of the quartz tube is inserted into the vacuum chamber;
   the fiber optic temperature sensor is located in the plasma in the vacuum chamber and fixed to the quartz tube;
   the fiber optic temperature sensor is connected to the circulator by means of an optical fiber passing through the quartz tube;
   the circulator is connected to the broadband light source and the spectrometer through optical fibers, respectively;
   the spectrometer is electrically connected to the computer which is configured to read and record spectra collected by the spectrometer,
   the two-dimensional driving system is configured to move the quartz tube horizontally and vertically;
   one end of the quartz tube is inserted into the vacuum chamber through the two-dimensional driving system; and
   an inner diameter of the quartz tube gradually decreases from the end inserted into the vacuum chamber to the other end.

2. The device for measuring gas temperature in plasma according to claim 1, wherein the inner diameter of the quartz tube gradually decreases from 0.1 cm to 0.02 cm.

3. The device for measuring gas temperature of plasma according to claim 1, wherein an end of the quartz tube that has the smallest inner diameter is sealed with a vacuum cement.

4. The device for measuring gas temperature in plasma according to claim 1, wherein the sealing system comprises a first rubber sealing ring, a first flange joint, a second rubber sealing ring, a second flange joint and a baffle;
   the first rubber sealing ring sleeves the first flange joint;
   the first flange joint and the second rubber sealing ring successively sleeve the quartz tube in a direction from the end, having the largest inner diameter, of the quartz tube to the end, having the smallest inner diameter, of the quartz tube;
   the second flange joint and the first flange joint are symmetrically disposed about the central position of the second rubber sealing ring, and the two ends of the second rubber sealing ring are clamped in the first flange joint and the second flange joint, respectively;
   the baffle sleeves the second flange joint; a screw hole is formed in the baffle;
   the first flange joint is connected to a flange port in the two-dimensional driving system, and the baffle is fixed to the two-dimensional driving system by means of a screw.

5. The device for measuring gas temperature in plasma according to claim 1, wherein each of the optical fibers has an outer diameter of 0.0125 cm.

* * * * *